United States Patent [19]

Abdo et al.

[11] Patent Number: 5,371,029
[45] Date of Patent: Dec. 6, 1994

[54] PROCESS FOR MAKING A LEADLESS CHIP RESISTOR CAPACITOR CARRIER USING THICK AND THIN FILM PRINTING

[75] Inventors: Azzam A. Abdo; Anwar A. Mohammed, both of San Jose, Calif.

[73] Assignee: National Semiconductor Corporation, Santa Clara, Calif.

[21] Appl. No.: 37,487

[22] Filed: Mar. 24, 1993

Related U.S. Application Data

[63] Continuation of Ser. No. 643,635, Jan. 22, 1991, abandoned.

[51] Int. Cl.$^5$ ............... H01L 21/58; H01L 21/60; H01L 21/70
[52] U.S. Cl. ................... 437/51; 437/208; 437/218
[58] Field of Search ... 437/51, 205, 208, 215, 217, 218, 915, 925; 29/851, 852, 830, 831, 832, 266, 258, 256, 52, 4; 361/399, 411, 414, 419, 420; 428/901; 156/89; 264/61

[56] References Cited

U.S. PATENT DOCUMENTS

| | | | |
|---|---|---|---|
| 3,926,746 | 12/1975 | Hargis | 437/925 |
| 4,051,550 | 9/1977 | Seno et al. | 361/411 |
| 4,195,326 | 3/1980 | Ruegg et al. | 29/25.42 |
| 4,288,841 | 9/1981 | Gogal | 361/414 |
| 4,295,271 | 10/1981 | Neuhoff et al. | 29/840 |
| 4,328,531 | 5/1982 | Nagashima et al. | 361/414 |
| 4,372,037 | 2/1983 | Scapple et al. | 29/832 |
| 4,419,818 | 12/1983 | Grabbe | 29/832 |
| 4,525,597 | 6/1985 | Abe | 174/52.4 |
| 4,532,190 | 7/1985 | Kanbe et al. | 428/671 |
| 4,551,747 | 11/1985 | Gilbert et al. | 361/414 |
| 4,641,425 | 2/1987 | Dubuisson et al. | 29/830 |
| 4,681,656 | 7/1987 | Byrum | 29/851 |
| 4,724,021 | 2/1988 | Martin et al. | 156/89 |
| 4,783,697 | 11/1988 | Benenati et al. | 174/52.4 |
| 4,870,746 | 10/1989 | Klaser | 29/830 |
| 4,906,802 | 3/1990 | Castleman | 29/832 |

FOREIGN PATENT DOCUMENTS

| | | | |
|---|---|---|---|
| 60-1847A | 8/1985 | Japan. | |
| 61-242030 | 10/1986 | Japan | 437/218 |
| 176747 | 3/1989 | Japan | 361/397 |
| 189547 | 4/1989 | Japan | 361/397 |
| 1138791 | 5/1989 | Japan. | |

OTHER PUBLICATIONS

A. C. Burgess et al., "Resistors On Multilayer Ceramic Substrates", IBM T.D.B., vol. 26, No. 4, Sep. 1983, pp. 1973–1974.

F. F. Fugardi et al., "Laser Drilled Holes in Fired Ceramics", IBM T.D.B., vol. 14, No. 10, Mar. 1972, p. 2869.

S. H. Kremen, "Laser Hole Making in Printed Circuit Boards", IBM T.D.B., vol. 8, No. 3, Aug. 1965, p. 43.

F. N. Sechi, et al., "Broadband Power Amplifiers Based on a New Monolithic Ceramic Technology," *Digest of the IEEE MTT-S Intl. Microwave Symposium* (1989) 1:937–940.

T. Ozawa, et al., "Micro Hybrid Circuits for Surface Mounting Technology," *Proc. of the IEEE 36th Elec. Components Conf.* (1986) pp. 10–15.

*Primary Examiner*—Olik Chaudhuri
*Assistant Examiner*—David E. Graybill
*Attorney, Agent, or Firm*—Townsend and Townsend Khourie and Crew

[57] ABSTRACT

A process for forming a leadless chip resistor capacitor carrier by forming a first capacitor plate using a first thick film printing sequence and forming the second capacitor plate using a second thin film printing sequence.

PROCESS FOR MAKING A LEADLESS CHIP RESISTOR CAPACITOR CARRIER USING THICK AND THIN FILM PRINTING

This is a continuation of application Ser. No. 07/643,635 Jan. 22, 1991, now abandoned.

BACKGROUND OF THE INVENTION

1. Field of the Invention

The present invention relates to a leadless chip resistor capacitor carrier (LCRCC) which is surface mountable to a printed circuit board. When populated with integrated circuits (ICs), the LCRCC provides a package for the ICs on the LCRCC.

2. Description of the Prior Art

Hybrid circuits are known in the prior art. A hybrid circuit typically includes a plurality of integrated circuits (ICs) mounted onto a hybrid board.

Prior to mounting the ICs onto the hybrid board, the ICs are first placed on a printed alumina substrate and wire bonded there to. The alumina substrate is then placed in a carrier and packaged. The carriers used to package the ICs include leaded chip carriers and leadless chip carriers. The ICs may also be packaged in a "TapePak" carrier. "TapePak" is a registered trademark of National Semiconductor Corporation, and is described in U.S. Pat. Nos. 4,701,781 and 4,801,561 assigned to the assignee of the present invention. Once the ICs are packaged, the carriers are ready to be mounted onto the hybrid board.

Referring to FIG. 1, a typical leaded chip carrier according to the prior art is shown. The leaded chip carrier 24 includes an alumina substrate 25 with a metallization interconnect and passive elements formed thereon, a thermally conductive pad 26, a plurality of leads 27, a ring 28 to hold the leads in position, and a cover 29. One or more ICs are mounted onto the alumina substrate 25 and wire bonds are formed between the ICs and the interconnect. The alumina substrate is then mounted onto the thermally conductive pad 26 and wire bonds are formed between the interconnect on the alumina substrate and the leads 27 of the carrier. The cover is then sealed over the carrier to complete the packaging of the IC in the carrier.

Referring to FIG. 2, a leadless chip carrier according to the prior art is shown. The leadless chip carrier 30 is identical to the leaded chip carrier 24, except the plurality of leads 27 are replaced by a plurality of conductive lines 32 which are held in position by the carrier 30. A plurality of contact regions 38 are arranged around the periphery of the carrier 30. Each of the surface contact regions 38 is coupled to one of the conductive lines 36. One or more ICs are mounted onto the alumina substrate 25 and wire bonds are formed between the ICs and the interconnect. The alumina substrate is then mounted onto the thermally conductive pad 26 and wire bonds are formed between the interconnect on the alumina substrate and the conductive lines 36 of the carrier. The cover is then sealed over the carrier to complete the packaging of the IC in the carrier.

A number of drawbacks are associated with the prior art carriers. First, an alumina substrate is required for mounting the ICs. Second, a separate leaded or leadless carrier is required to package and cover the ICs on the alumina substrate. Third, once the carrier is covered and mounted onto either a hybrid circuit or a PC board, the passive devices formed on the alumina substrate cannot be trimmed. The consequences of these problems are discussed in detail below.

Alumina substrates are made using a number of manufacturing techniques, including thick film, thin film or a green tape process. Which ever technique is used, a series of masking, printing and firing steps is required to selectively pattern the conductive areas of the interconnect and the passive elements onto the top surface of the alumina substrate.

Leaded, leadless and "TapePak" carriers are expensive and difficult to manufacture. For plastic carriers, a customized injection mold is required to form the carrier and the cover. For ICs which need to be hermetically sealed, a custom fitted ceramic carrier and cover are required. Whether a plastic or ceramic carrier is used, substantial tooling, equipment and capital is required to produce the leaded and leadless chip carriers. In addition, the substrate of the hybrid must also be manufactured. Accordingly, the carriers and substrate represent a significant percentage of the overall cost of a hybrid.

The material used to form the carriers, whether plastic or ceramic, is usually different than the alumina used to form the substrate of the hybrid. Thus during hybrid operation, the carrier may become heated, resulting in a thermal mismatch between the carrier and the substrate of the hybrid.

After mounting the carrier onto either a hybrid circuit or a PC board, the passive elements on the alumina substrate can not be actively trimmed. Without the ability to trim, the output parameters of the ICs within the carrier cannot be matched with those of other electrical devices on the hybrid circuit or PC board. As a result, the integrity and speed of the data transmitted between the IC(s) in the carrier and other devices on the hybrid circuit or the PC board may be less than ideal.

If a significant mismatch exists between an IC in the carrier and these other devices, a re-design of of the ICs may be required. Re-design is an expensive task, requiring significant engineering effort to change the circuit design, layout and/or mask set for the IC. In addition, the re-design will often take months to complete, which can significantly reduce the market opportunity of a semiconductor manufacturer.

SUMMARY OF THE INVENTION

The present invention relates to a leadless chip resistor capacitor carrier (LCRCC). The LCRCC includes an alumina substrate which is selectively patterned on both its top and bottom surfaces. Contact regions are provided on the bottom of the LCRCC so it can be surface mounted directly onto a hybrid or a PC board. A metallization pattern, including thermally conductive die pad regions, an interconnect having a plurality of conductive lines and passive elements including trimmable resistors, capacitors and the like, is formed on the top surface of the LCRCC. Through holes formed through the LCRCC so that the conductive lines on the top surface are in electrical contact with the contact regions on the bottom of the LCRCC.

To populate the LCRCC and package the ICs, the ICs are directly attached to the thermally conductive regions on the LCRCC. Wire bonds are then formed between the ICs and the conductive lines. The ICs are thus electrically coupled to one another and to the contact regions on the bottom of the LCRCC via the conductive lines and through holes respectively.

Once mounted onto a hybrid or a PC board, the LCRCC may be actively trimmed. Thus, selected electrical parameters of the IC(s)) on the LCRCC, such as resistance and capacitance, may be matched with other electrical device.

The LCRCC of the present invention provides a number of advantages over the prior art. First, since the LCRCC is surface mountable, the need for a carrier as described in the prior art is eliminated. The time, effort and expense of manufacturing the prior art carriers is thus eliminated. The problem of thermal mismatch between the carrier and the hybrid circuit or a PC board is also eliminated. Second, since the passive devices on the LCRCC can be trimmed after being mounted, the LCRCC offers better operational performance and eliminates electrical mismatch problems between ICs on the LCRCC and the other electrical devices.

DETAILED DESCRIPTION OF THE PREFERRED EMBODIMENT

Figure 1:
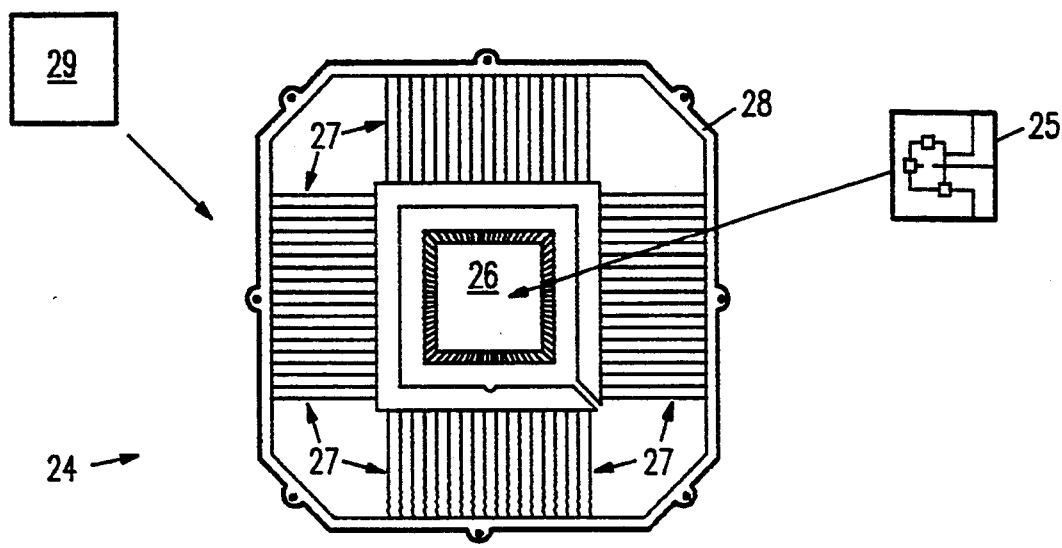
FIG. 1 is a typical leaded chip carrier according to the prior art.
Figure 2:
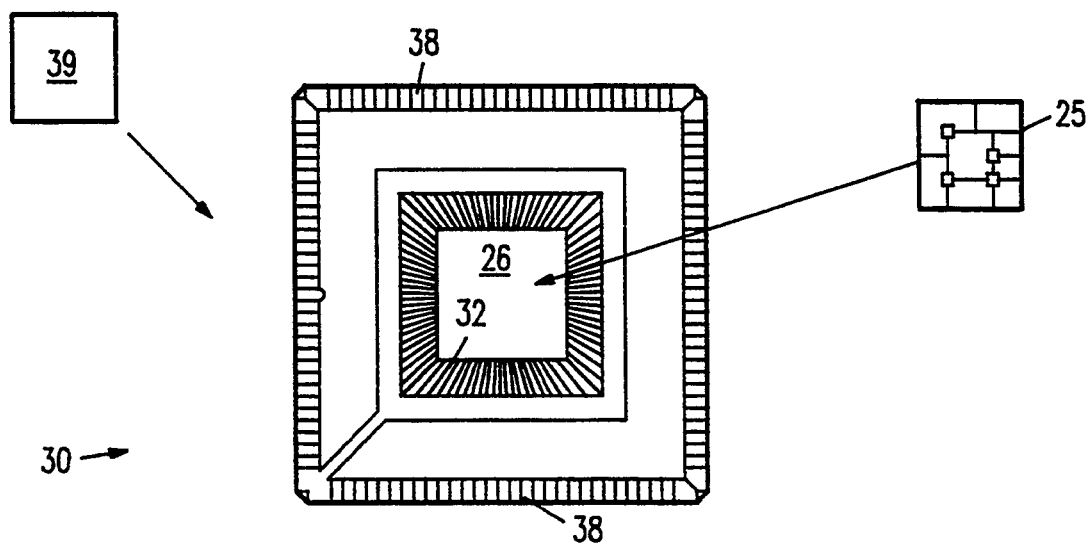
FIG. 2 is a typical leadless chip carrier according to the prior art.
Figure 3:
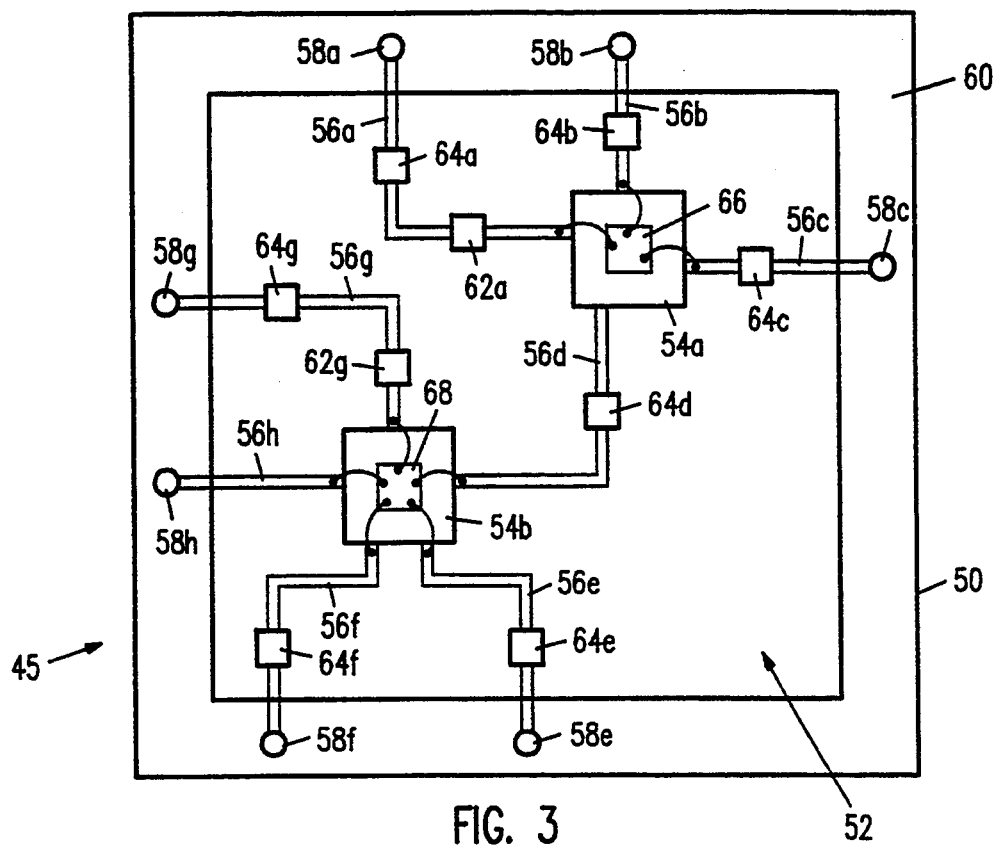
FIG. 3 is a top view of a leadless chip resistor capacitor carrier (LCRCC) according to present invention.

Referring to FIG. 3, a top view of the leadless chip resistor capacitor carrier (LCRCC) according to the present invention is shown. The LCRCC 45 includes a carrier 50, a top surface 52 selectively patterned with a plurality of conductive die pad regions 54a and 54b, a plurality of conductive lines 56a through 56h, a plurality of contact holes 58a through 58h formed through the carrier, a dielectric 60 around the periphery of the top surface 52, and passive elements including trimmable capacitors 62a and 62g and trimmable resistors 64a through 64g.

A first micro-electronic component, such as an IC 66, is attached to die pad region 54a and is wire bonded to conductive lines 56a, 56b, 56c and 56d. Capacitor 62a and resistors 64a through 64d are formed along conductive lines 56a through 56d respectively. A second IC 68 is attached to die pad region 54b and wire bonded to conductive lines 56d, 56e, 56f 56g and 56h. Resistors 64d, 64e, 64f and 64g and capacitor 62g are formed along conductive lines 56d through 56g respectively. It is noted that conductive line 56d is coupled between ICs 66 and 68. The resistor 64d may be actively trimmed to matched the operational outputs of ICs 66 and 68 respectively. A passive element is not formed along conductive line 56h.

It is important to note that the pattern shown in FIG. 3 is merely an illustrative example. The top surface 52 may be populated with one or more micro-electronic components and trimmable devices arranged in a variety of different layouts.

Figure 4:
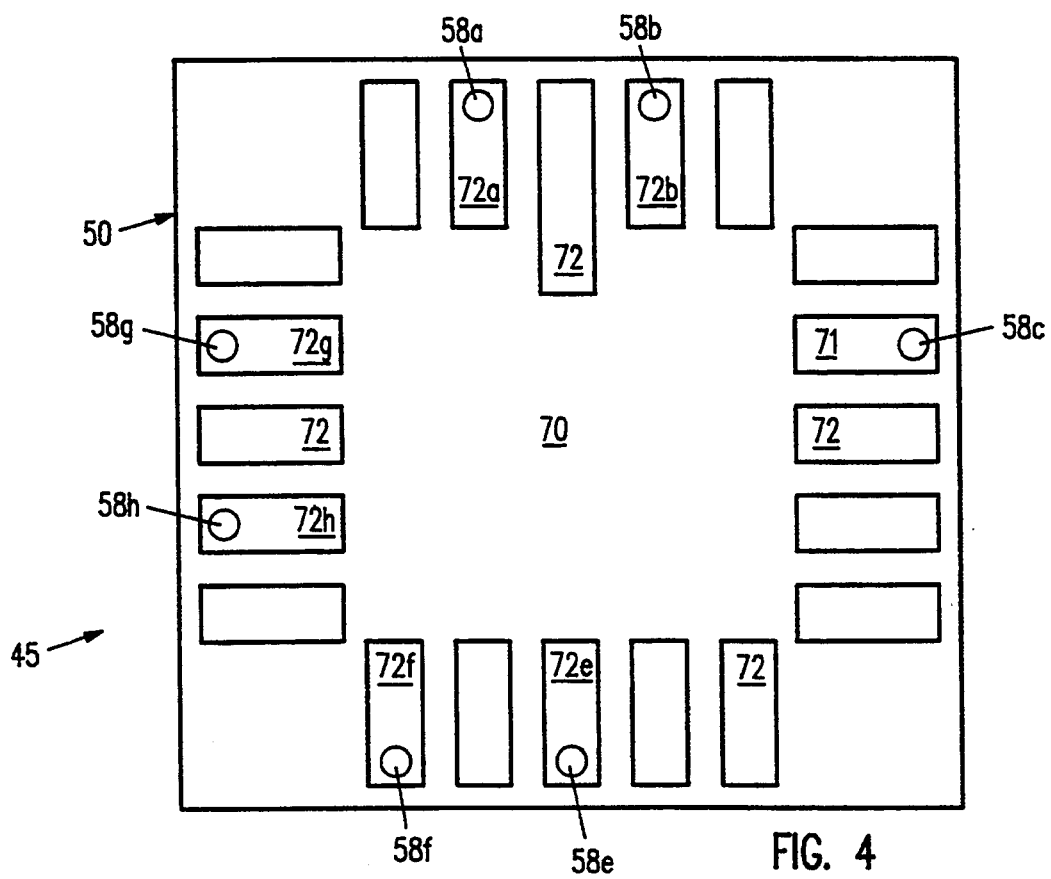
FIG. 4 is a bottom view of the LCRCC according to the present invention.

Referring to FIG. 4 a bottom view of the LCRCC is shown. The underside of the LCRCC 45 includes a bottom surface 70 and a plurality of contact regions 72 made of an electrically conductive material. Selected ones of the contact regions 72a through 72h are electrically coupled to the ICs 66 and 68 on top surface 52 of the carrier 50 through contact holes 58a through 58h and conductive lines 56a through 56h respectively.

Figure 5:
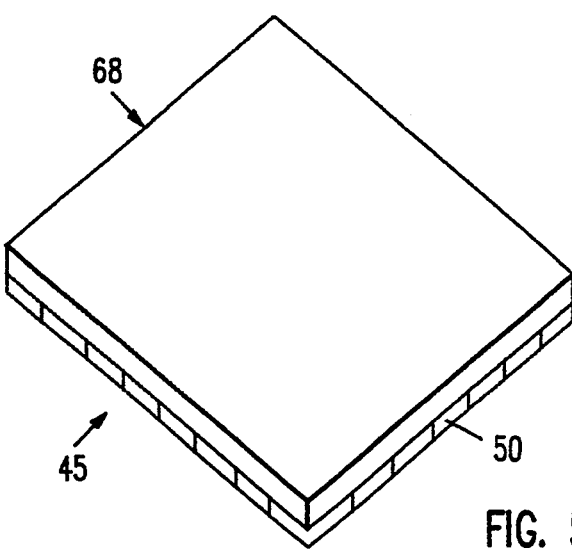
FIG. 5 is a perspective view of the LCRCC with a lid according to one embodiment of the present invention.

Referring to FIG. 5, a perspective view of an alternative embodiment of the present invention is shown. A plurality of leads 74 are soldered to the contact regions 72 on the bottom surface of the LCRCC 45. The leads 74 thus convert the LCRCC 45 to a leaded carrier.

Figure 6:
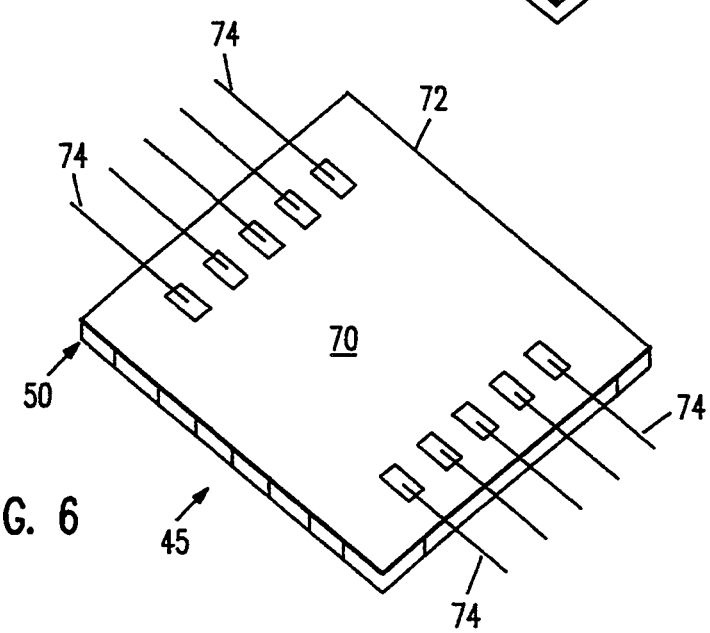
FIG. 6 is a perspective view of a LCRCC with leads according to an alternative embodiment of the present invention.

Referring to FIG. 6, a top view of the LCRCC 45 mounted onto a PC board is shown. The PC board 90 includes a selectively patterned substrate 92, a plurality of conductive lines 94, a plurality of other electrical devices 96, and contact regions 98 formed around the periphery of the PC board. During surface mounting of the LCRCC to the PC board, the selected contact regions 72 of each LCRCC 45 are aligned with corresponding conductive regions on the PC board (not shown). The conductive lines 94 enable the ICs on the LCRCC to communicate with other electrical devices 96 and contact regions 98 on the PC board. Once the LCRCC is mounted onto the PC board, the resistors 64a through 64f and capacitors 62a and 62f may be trimmed so that selected electrical parameters of the ICs on the LCRCC may be matched with those of the other electrical devices 96 on the PC board. In other embodiments, the LCRCC may be mounted to a hybrid circuit and trimmed in a similar manner.

Figure 7:
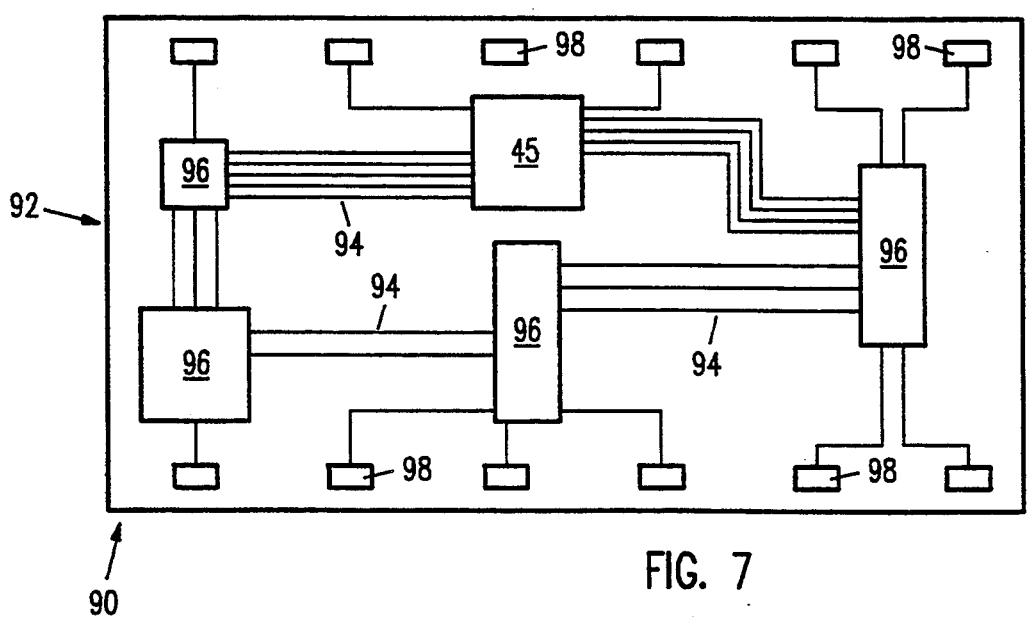
FIG. 7 is a top view of several LCRCCs mounted onto a hybrid circuit board according to the present invention.

Referring to FIG. 7, a perspective view of the LCRCC is shown covered with a protective lid according to one embodiment of the present invention. A lid 68 may be used to cover and protect the LCRCC after being mounted onto the PC board 90. In preferred embodiments of the present invention, the lid 68 may be made of metal, epoxy, or ceramic. The height of the lid 68 may range from 10 mils to 500 mils to accommodate any components, such as heat sinks, which may be mounted onto the ICs. In alternative embodiments of the present inventions, the lid 68 may be permanently attached prior to mounting the carrier to the PC board. This of course would prevent the passive elements from being trimmed after the LCRCC is mounted onto the PC board.

LCRCC Manufacture

In steps one through nine as set forth below with reference to FIGS. 3 and 4, a preferred embodiment for manufacturing an LCRCC 45 is described. In one embodiment of the present invention, a blank carrier 50 comprising approximately 96% alumina and 4% impurities such as magnesium and/or calcium is used. This ratio of alumina to impurities provides a highly insulative carrier. Furthermore, since most hybrid and PC boards are made of the same or a similar material, the problems of thermal mismatch between the LCRCC and the boards do not occur.

In other embodiments, impurities of beryllium oxide (BEO) and Aluminum Nitride (AlN) could be used for the carrier in high powered applications due to the high thermal conductivity of such materials. A carrier 50 containing 99% alumina could be used for high performance hybrid circuit embodiments. For inexpensive low performance hybrid circuits, the carrier 50 may be made of a lower grade of alumina like steatite and/or mullite.

In the first manufacturing step, the contact holes 58 are formed in a blank carrier. The holes are formed by a laser scribing or a green punch process at the predetermined desired locations 58a through 58h.

In the second manufacturing step, the back surface 70 of the carrier 50 is washed in (1.1.1) trichloroethane (TCE). The TCE removes deposits and contaminants from the surface of the carrier 70 and prepares the back surface 70 for subsequent manufacturing steps.

In the third step, the electrical contact regions 72 are formed on the back surface 70 of the carrier 50 using either thick film, thin film or photolithography techniques.

In the thick film embodiment of the present invention, the contact regions 72 are formed by silk screening a metallic paste containing glass through a selectively patterned screen onto the back surface 70. In the alternative thin film embodiment, the electrical contact regions 72 may be formed by sputtering a layer of the metallic paste containing glass onto the back surface 72. In subsequent photolithography procedures, the metallic layer is masked and etched to form the contact regions 72. In either embodiment, the metallic paste may include for example, gold, aluminum, silver, platinum, copper or an alloy thereof.

During the third step, while the metallic paste is deposited onto bottom surface 70, a vacuum is applied to the top surface 52 of the LCRCC 45. The vacuum sucks the metallic paste through the contact holes 58a through 58h toward the top surface 52 of the carrier 50.

In the fourth step, the carrier 50 is dried. In a preferred embodiment, the carrier is dried by heating it to 150 degrees C. for approximately 15 minutes. The elevated temperature is sufficient to cause the organic binders in the metallic paste to evaporate.

In the fifth step, the carrier is fired. The elevated temperatures during firing causes the glass in the metallic paste to melt so that the selectively patterned metal adheres to the back of the carrier 70 to form contact regions 72. In a preferred embodiment, the carrier 50 is fired to 800 to 1000 degrees C. for 5 to 15 minutes.

The following process steps six through eight are used for forming the selective pattern on the top surface of the LCRCC. These steps may be altered and/or repeated depending on the desired patterned to be formed. For example, to form capacitors 62a and 62g, a first metallization step is used to form the lower plate, a dielectric is deposited over the lower plate in a second step, and finally another metallization step is used to form the top plate. To form conductive lines 56a through 56g with resistors 64a through 64g respectively, the metal runs which form the lines are patterned with physical breaks in the runs during a metallization step. In a subsequent step, a resistive material is deposited between the breaks to form the resistors.

In the sixth step, the top surface 52 of the carrier 50 is selectively patterned with metal. The selectively patterned metal is used to form die pad regions 54a and 54b, lines 56a through 56g and the bottom plate of the capacitor 62 (not shown). Metal is selectively patterned onto the top surface 52 of the LCRCC using the same wash, print, dry and fire sequence as described in steps two through five. In preferred embodiments, the metal paste used to form die pad regions 54a and 54b and leads 56 comprise a metal, for example gold, copper, silver, aluminum or an alloy thereof. If two types of metal are desired on the top surface 52, i.e., gold die pad regions 54a and 54b and aluminum lines 56a through 56f, the metallization sequence must be repeated on the top surface 52.

While the metallic paste is being deposited onto the top surface 52, a vacuum is applied to the back surface 70 of the carrier 50. The vacuum sucks the metallic paste down through the contact holes 58a through 58f toward the bottom surface 70. The combination of vacuum sucking the metallic paste while processing the top and bottom surfaces of the carrier is sufficient to plate the interior regions of the contact holes 58a through 58h. Thus, electrical contact is made between the selected surface contact regions 72a through 72h on the bottom surface 70 and the conductive lines 56a through 56h on the top sur face 52 of the carrier 50.

In the seventh step, a dielectric material is selectively deposited onto the top surface 52 of the carrier 50. The dielectric material forms the dielectric region 60 around the perimeter of the carrier and the dielectric (not shown) formed over the bottom plate of capacitors 62a and 62g. The dielectrical material may be selectively deposited using either thick or thin film techniques. In preferred embodiments, the dielectric material may include for example, a glass or barium titatmate, or a similar material. The second or top plate of the capacitors is formed using another metallization sequence on the top surface 52 of the carrier 50.

In the eighth step, a resistive material is selectively deposited in between the breaks along conductive lines 56a through 56g on the top surface 52 of the carrier using either thick or thin film techniques to form resistors 64a through 64g. In preferred embodiments, the resistive materials may include a ruthenium-glass combination, a bismuth ruthenate-glass combination, or a similarly resistive material.

In the ninth step, the capacitors 62a and 62g and resistors 64a through 64g are passively trimmed prior to populating the LCRCC. Passive trimming involves the steps of measuring an electrical characteristics of a passive element (e.g., the resistance) of a resistor on the LCRCC using a probe. If the measured resistance is below specifications, the resistor on the LCRCC may be trimmed to increase its resistance.

Populating, Surface Mounting, Active Trimming and Packaging the LCRCC

In steps ten through fifteen, the process by which the LCRCC 45 is populated, packaged, surface mounted onto a circuit board and then actively trimmed is described.

In step ten, IC chips 66 and 68 are mounted directly onto the die pad regions 54a and 54b respectively. IC chips may be mounted using a number of known methods, including epoxies, solder and eutectic die attach.

In step eleven, wire bonds between the ICs 66 and 68 and the carrier leads 56a through 56h are respectively formed. The LCRCC may be actively trimmed at this stage of the manufacturing process for the purpose of matching the output parameters of one IC with those of another on the LCRCC. This is accomplished by running the IC on the LCRCC through a test sequence and measuring its output parameters. If a particular output parameter does not equal the desired value, the value of the parameter can be adjusted by trimming the capacitor and/or resistor on the particular line from which the parameter was measured. For example, if the resistance along line 56d is too low, the resistor 64d may be trimmed by a laser to increase the resistance between ICs 66 and 68.

In an optional step twelve, the leads 74 (FIG. 6) are soldered onto the back surface 70 of LCRCC 45.

In step thirteen, the LCRCC is mounted onto a PC board and the hybrid is now ready for testing and operation.

In an optional step fourteen, the passive devices on the LCRCC may again be actively trimmed. At this stage of the manufacturing process, the purpose of active trimming is to match the output parameters of an IC on the LCRCC with with one of the electrical devices 96 on the PC board or hybrid circuit.

In an optional step fifteen, the lid 68 (FIG. 5) may be mounted onto the top of the LCRCC either before or after the LCRCC is mounted onto the PC board 90.

Figure 8:
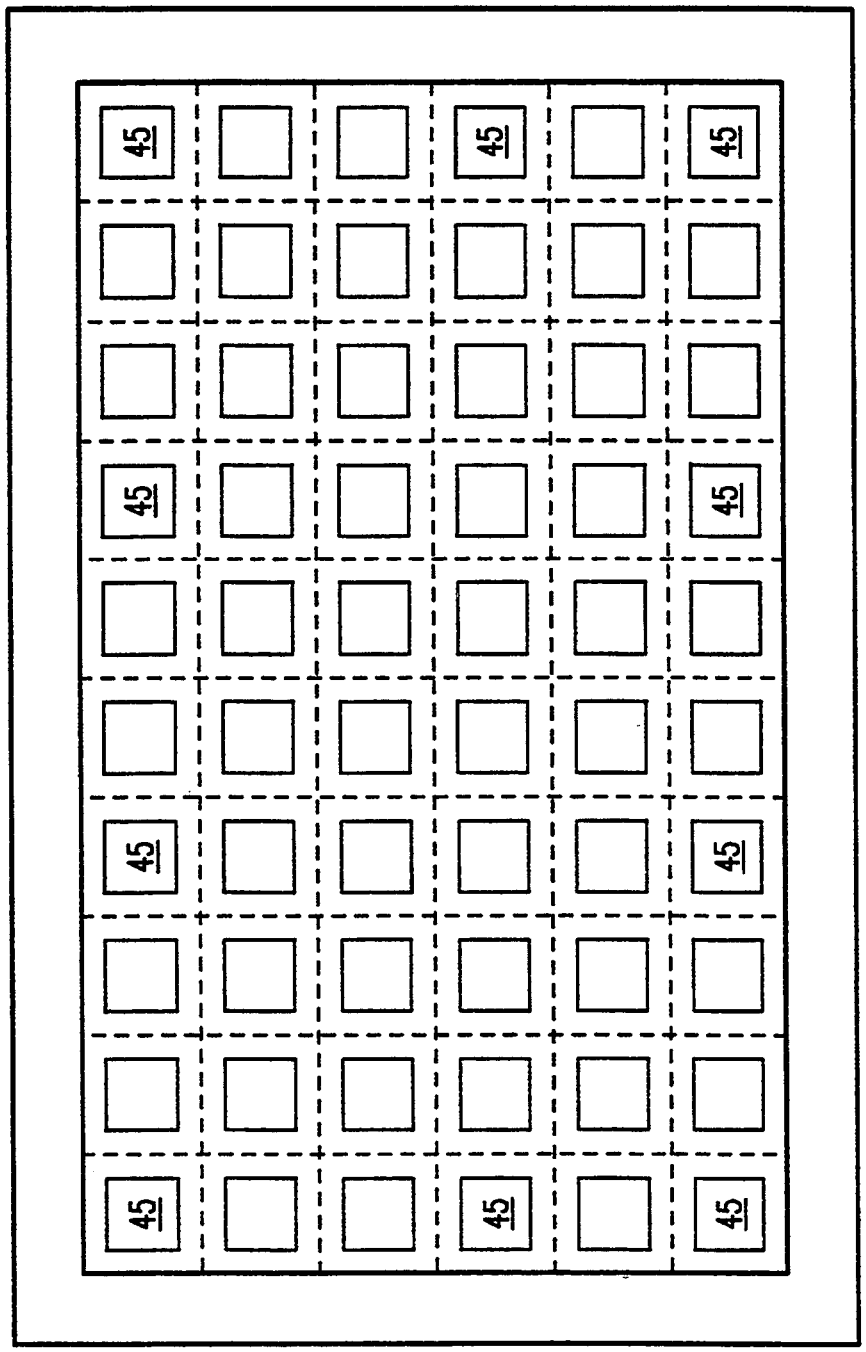
FIG. 8 is a top view of a matrix of LCRCC as manufactured according to one embodiment of the present invention.
Figure 9:
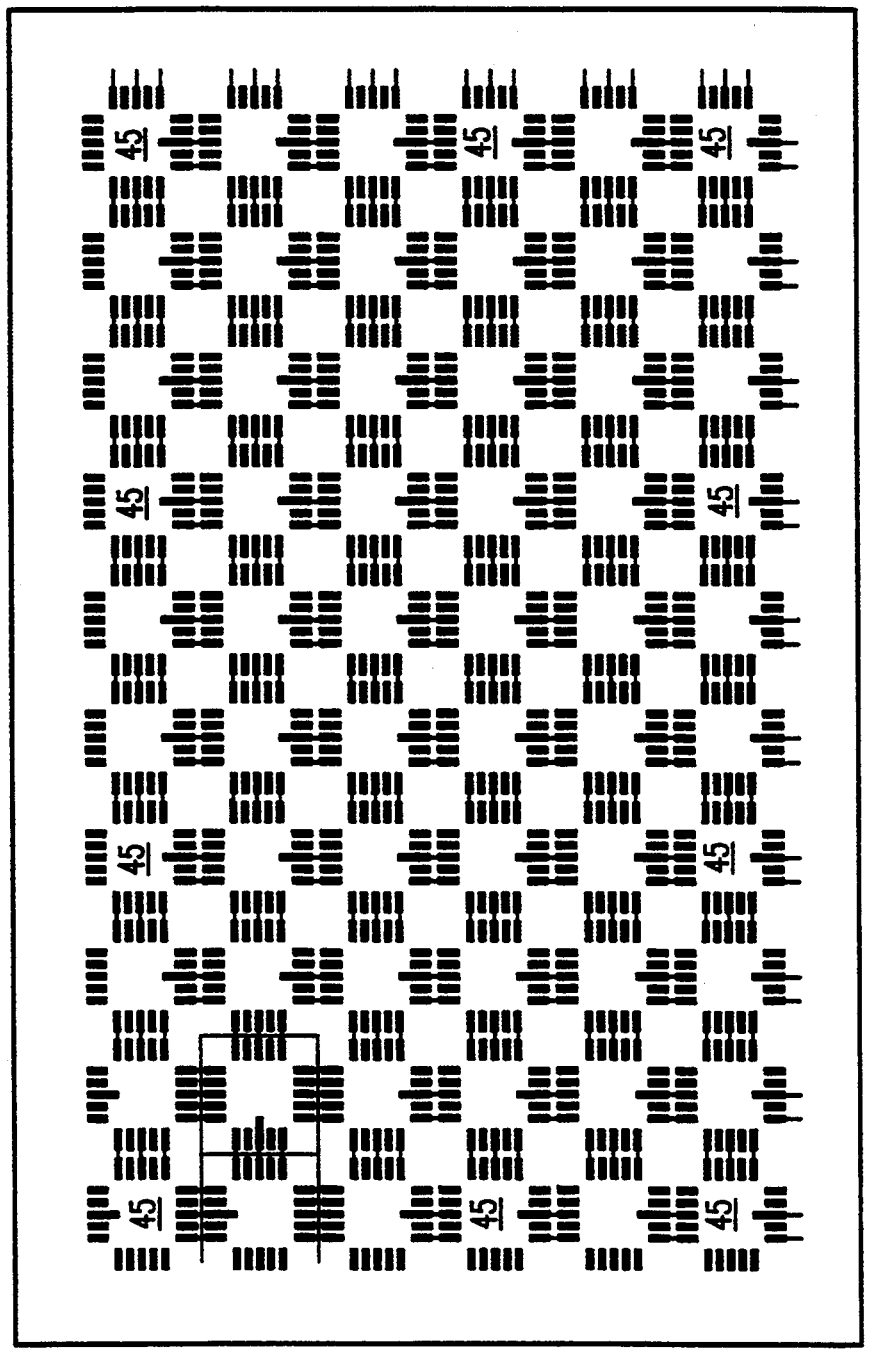
FIG. 9 is a bottom view of the matrix of LCRCC as shown in FIG. 8 according to the present invention.

Referring to FIGS. 8 and 9, a top and a bottom view of a matrix 80 of LCRCCs 45 are shown for the purpose of illustrating a preferred embodiment for manufacturing the LCRCCs. In this preferred embodiment, all of the back surfaces 70 of the matrix of LCRCCs 45 are simultaneously processed according to the manufacturing steps one through five as described above. Subsequently, the top surfaces of the LCRCCs of the matrix are simultaneously processed according to the processing steps six through nine as described above. The individual LCRCCs 45 of the matrix are then scribed and removed from the matrix 80 to form individual unit LCRCCs 45 which are then ready for mounting in accordance with steps ten through fifteen. The mass production of LCRCCs 45 in matrix form significantly reduces the per unit costs of manufacturing the LCRCCs. It is estimated that the cost of the LCRCC of the present invention is approximately one quarter that of the prior art hybrids and carriers.

The LCRCC of the present invention provides a number of advantages over the prior art. First, since the LCRCC is surface mountable, the need for a carrier as described in the prior art is eliminated. The time, effort and expense of manufacturing the prior art carriers is thus eliminated. The problem of thermal mismatch between the carrier and the hybrid circuit or a PC board is also eliminated. Second, since the passive devices on the LCRCC can be trimmed after being mounted, the LCRCC offers better operational performance and eliminates electrical mismatch problems between ICs on the LCRCC and the other electrical devices.

Other embodiments of the invention will be apparent to those skilled in the art from a consideration of this specification or practice of the invention disclosed herein. It is intended that the specification and examples be considered as exemplary only, with the true scope and spirit of the invention being indicated by the following claims.

What is claimed is:

1. A method of manufacturing a carrier for carrying one or more integrated circuits and passive elements, the method comprising the steps of:

forming through holes at selected locations of a blank substrate having a top and a bottom surface;

forming selectively patterned electrical surface contacts on said bottom surface of said carrier using a printing sequence and metallic paste;

applying a vacuum to said top surface to suck metallic paste through said holes;

forming a selectively patterned metallization interconnect on said top surface of said carrier using said printing sequence;

forming passive elements including a capacitor electrically coupled to said metallization interconnect on said top surface of said carrier;

said capacitor being formed by the steps of:
forming a first capacitor plate on said substrate during a first thick film printing sequence;
depositing a dielectric material on said first plate;
forming a second capacitor plate on said dielectric material during a second thin film printing sequence;

electrically coupling said metallization interconnect on said top surface to said electrical surface contacts on said bottom surface through said holes of said carrier; and placing a lid on said top surface of said carrier.

2. The method of claim 1, further comprising the step of actively trimming said passive device.

3. The method of claim 1, wherein said step of forming through holes comprises the step of laser scribing said blank substrate.

4. The method of claim 1, wherein said step of forming through holes comprises a green punch process.

5. The method of claim 1, wherein said printing sequence further comprises the steps of:

washing the substrate to remove impurities;

selectively printing the substrate to form said electrical surface contacts and metallization interconnect; and firing said substrate for a sufficient period of time at a sufficient temperature so that said printed surface contacts and metallization interconnect adheres to said substrate.

6. The method of claim 5, wherein said substrate is fired at 800 to 1000 degrees C. for 5 to 15 minutes.

7. The method of claim 1, wherein said passive elements include a resistor.

8. The method of claim 1, wherein said resistor is formed by the step of selectively depositing a resistive material onto said top surface of said substrate.

9. The method of claim 1, further comprising the step of attaching a lead to said surface contact on said bottom surface of said carrier.

* * * * *